United States Patent
Chen

(10) Patent No.: US 8,498,120 B2
(45) Date of Patent: Jul. 30, 2013

(54) LOCKING STRUCTURE FOR DRAW-TYPE ELECTRONIC DEVICE

(75) Inventor: Jung-Lung Chen, Taipei (TW)

(73) Assignee: Inventec Corporation, Taipei (TW)

( * ) Notice: Subject to any disclaimer, the term of this patent is extended or adjusted under 35 U.S.C. 154(b) by 375 days.

(21) Appl. No.: 13/009,441

(22) Filed: Jan. 19, 2011

(65) Prior Publication Data

US 2011/0273850 A1 Nov. 10, 2011

(30) Foreign Application Priority Data

May 5, 2010 (TW) .............................. 99114447 A

(51) Int. Cl.
*H05K 5/00* (2006.01)
*H05K 7/16* (2006.01)
*A47B 81/00* (2006.01)

(52) U.S. Cl.
USPC ................ 361/726; 361/679.57; 361/679.58; 361/727; 361/732; 312/223.1; 312/223.2

(58) Field of Classification Search
USPC .. 361/679.31–679.39, 679.4, 679.41–679.45, 361/679.57–679.6, 724–733, 796–804, 826–829; 312/223.1, 223.2, 223.3
See application file for complete search history.

(56) References Cited

U.S. PATENT DOCUMENTS

| 4,003,614 | A | * | 1/1977 | Geer et al. ................ 312/332.1 |
| 5,020,151 | A |   | 5/1991 | Sampei et al. |
| 6,231,144 | B1 | * | 5/2001 | Chen et al. ................ 312/332.1 |

FOREIGN PATENT DOCUMENTS

TW 428743 Y 4/2001

* cited by examiner

*Primary Examiner* — Jayprakash N Gandhi
*Assistant Examiner* — Jerry Wu
(74) *Attorney, Agent, or Firm* — Morris Manning & Martin LLP; Tim Tingkang Xia, Esq.

(57) ABSTRACT

A locking structure for a draw-type electronic device includes a handle member, two connecting rod members, and two linked members. The handle member and the linked members are pivotally connected on a case of the electronic device respectively in a rotatable relation. The connecting rod members are connected to the handle member and the linked members. A first fastening groove and a second fastening groove are disposed on each of the linked members and the handle member respectively. The handle member is rotated to enable the connecting rod members to actuate the linked members to rotate together, so as to enable the first fastening groove and the second fastening grooves to apply forces on two corresponding positioning pins together, so that an action of electrical connection is accomplished.

7 Claims, 6 Drawing Sheets

LOCKING STRUCTURE FOR DRAW-TYPE ELECTRONIC DEVICE

CROSS-REFERENCE TO RELATED APPLICATIONS

This non-provisional application claims priority under 35 U.S.C. §119(a) on Patent Application No(s). 099114447 filed in Taiwan, R.O.C. on May 5, 2010, the entire contents of which are hereby incorporated by reference.

BACKGROUND OF THE INVENTION

1. Field of Invention

The present invention relates to a locking structure, and more particularly to a locking structure applicable to a draw-type electronic device.

2. Related Art

In a common computer device such as a personal computer or a server, in order to provide better expandability and facilitates maintenance by information technology (IT) personnel, a data access device such as a hard disk is draw-type. That is to say, a plurality of installation grooves is provided at a main unit. The access device is installed in a draw-type case. By using a hot plugging technology, a plurality of access devices can be expanded at any time for the main unit or an access device with a failure is removed for maintenance or replacement.

In order to realize the hot plugging technology, a connector unit is disposed at an end of the main unit corresponding to the installation groove, and an edge connector is disposed at the access device. When the access device is inserted in the installation groove of the main unit, the edge connector has to be inserted in the connector unit at the same time, so as to realize an electrical connection between the access device and the main unit.

In U.S. Pat. No. 6,231,144, a case separation mechanism for an electronic device is disclosed. The separation mechanism includes a handle. The handle is pivotally connected on the case in a rotatable relation. A user can hold the handle to pull or push the case to move. When the case moves to a fixed position, the handle can be folded to the case. Also, in U.S. Pat. No. 5,020,151, a release mechanism for an audio device is disclosed. The release mechanism includes a handle and a linked mechanism. A user can hold the handle to pull or push the audio device to move. When the audio device is moved to a fixed position, the handle can be folded to the case.

In the existing technology, the access device is disposed in the installation groove of the main unit. In order to enable the access device to move inside the installation groove smoothly, a gap exists between the access device and the installation groove. When pushing or pulling the access device with the handle, the user has to move the access device smoothly, so that the edge connector of the access device is inserted in the connector unit to accomplish electrical connection. However, when the user applies a force, the edge connector of the access device might fail to match a position of the connector unit correctly due to the gap between the access device and the installation groove, or an installation position of the handle on the access device, or the way in which the user applies the force. At this time, not only a correct electrical connection cannot be established, the inappropriate force application might also cause the edge connector to impact the connector unit, thereby causing damages. A heretofore unaddressed need exists in the art to address the aforementioned deficiencies and inadequacies.

SUMMARY OF THE INVENTION

For an existing draw-type electronic device, incorrect electrical connection might occur or even an edge connector or a connector unit might be damaged due to inappropriate installation position of a handle or inappropriate way in which a user applies a force. In view of this, the present invention relates to a locking structure for a draw-type electronic device.

The present invention provides a locking structure for a draw-type electronic device, which is disposed on a case of an electronic device. The locking structure comprises a handle member, two connecting rod members, and two linked members. The linked members are pivotally connected on two side walls of the case of the electronic device in a rotatable relation. Each of the linked members has a first fastening groove. The handle member is pivotally connected on the case of the electronic device in a rotatable relation. The handle member has a second fastening groove. Each of the connecting rod members is connected to the handle member and one of the linked members. When the handle member is controlled to push the electronic device to move into an installation groove of a main unit, the handle member is rotated to actuate the linked members to rotate together through the connecting rod members. The first fastening member and the second fastening member on the linked members and the handle member apply forces on two corresponding positioning pins in the main unit together, so that an edge connector of the electronic device can match the connector unit in the main unit correctly. The handle is pushed continuously to insert the edge connector in the connector unit, so as to accomplish an action of electrical connection.

A joint unit may be disposed on the edge connector. The electronic device shifts for the distance to enable the joint unit of the edge connector to be inserted in the connector unit, so that an electrical connection between the electronic device and the main unit is accomplished.

In the locking structure for the draw-type electronic device according to the present invention, through the design of synchronous actions of the handle member and the linked members and by enabling the first fastening groove and the second fastening groove of the linked members and the handle member to match two positioning pins in the main unit, the electronic device can be effectively controlled to electrically connect the edge connector and the connector unit correctly smoothly, so as to ensure a correct electrical connection relation and avoid damages of the edge connector and the connector unit due to inappropriate force application.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

A locking structure for a draw-type electronic device according to the present invention is applicable to an electronic device that can be drawn out and replaced. The electronic device refers to an access device such as a hard disk or a sub-server such as an array structure server. The electronic device is integrated to a main unit of a computer or a master server. In the illustration of the embodiments below, the drawable hard disk or sub-server is collectively referred to as the draw-type electronic device, and the computer or server is collectively referred to as the main unit.

Figure 1:
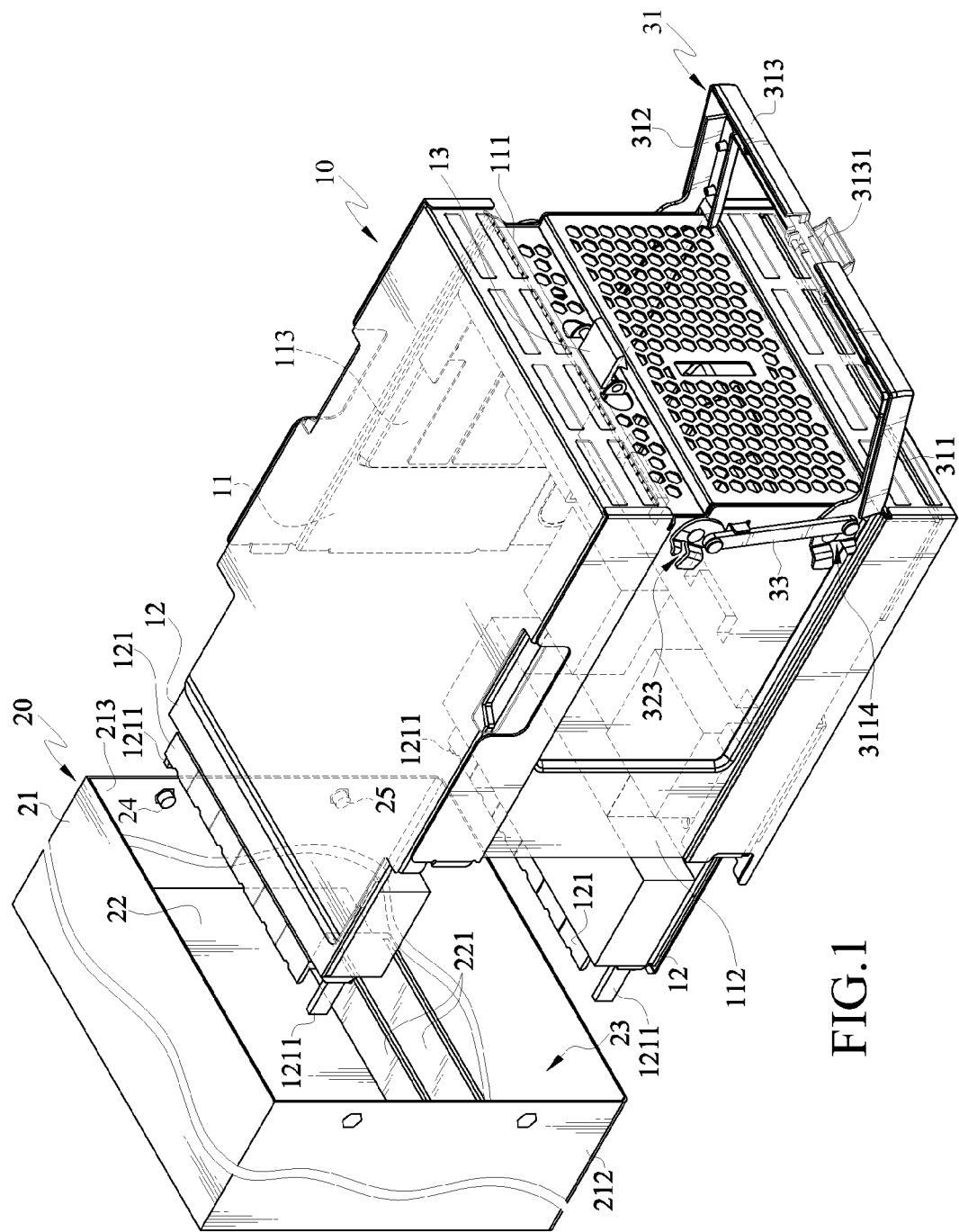
FIG. 1 is a schematic view of the composition of an application example according to the present invention.

FIG. 1 shows a locking structure for a draw-type electronic device according to the present invention. The draw-type electronic device 10 is installed in the main unit 20 in a way that the electronic device 10 can be assembled in or detached from the main unit 20.

The draw-type electronic device 10 comprises a case 11. Various electronic components (not shown) that form functions of the draw-type electronic device 10 are installed in the case 11. The electronic components at least comprise a motherboard 12 and an edge connector 121 located at an end of the motherboard 12. In addition, a fastener 13 is disposed at a top edge of a front panel 111 of the case 11.

A main unit 20 comprises a case 21. Various electronic components (not shown) that form functions of the main unit 20 are installed in the case 21. The electronic components at least comprise a motherboard 22 and a plurality of connector units 221 installed on the motherboard 22. A plurality of installation grooves 23 corresponding to the connector units 221 is formed on the case 21. The electronic device 10 can be placed in the installation grooves 23. In addition, a plurality of positioning pin 24 and 25 are respectively disposed above and below a position corresponding to the connector unit 221 on two side walls 212 and 213 of the case 21 (only the side wall 212 is illustrated, and the layout on the side wall 213 is the same).

Figure 2:
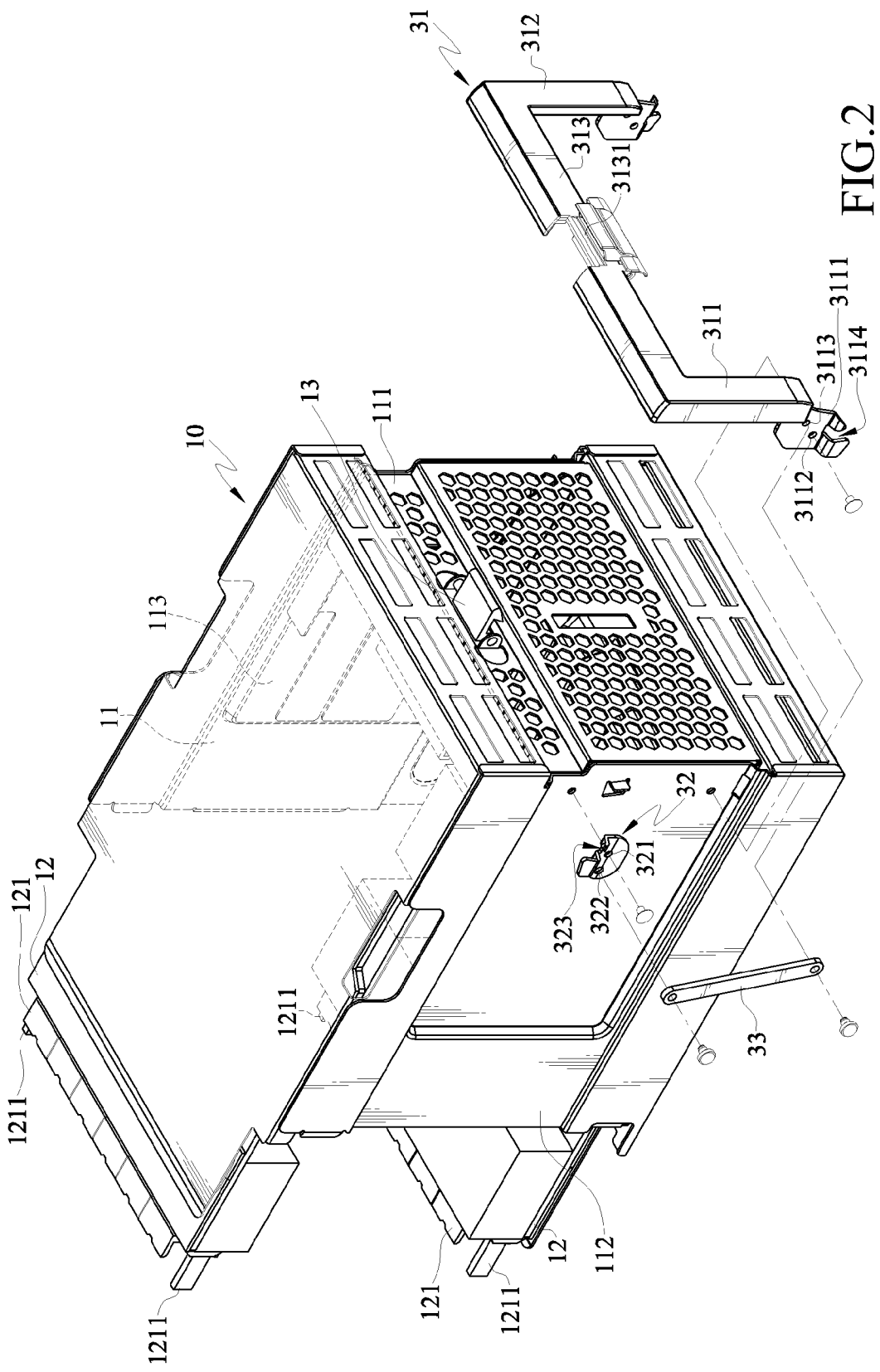
FIG. 2 is a schematic view of the composition of a structure according to the present invention.
Figure 3:
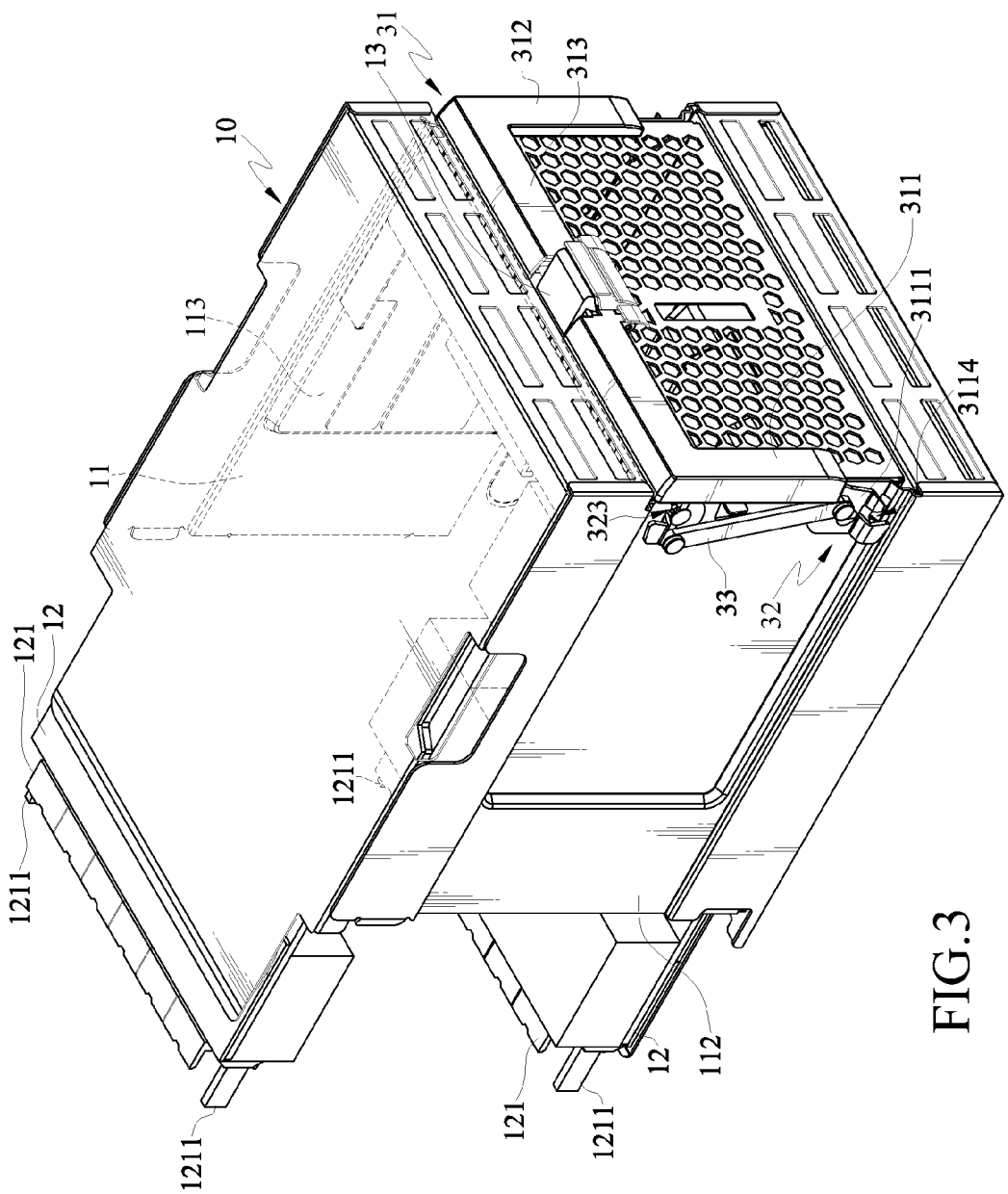
FIG. 3 is a schematic exploded view of a structure according to the present invention.

FIGS. 2 and 3 show a locking structure 30 for a draw-type electronic device according to the present invention, which is disposed on side walls 112 and 113 of the electronic device 10. A locking structure 30 comprises a handle member 31, two linked member 32, and two connecting rod member 33. The linked members 32 are disposed in pairs and disposed on the side walls 112 and 113 in a rotatable relation. Only the side wall 112 is illustrated below. Only the linked member 32 and the connecting rod member 33 on the side wall 212 are described below, and the linked member 32 and the connecting rod member 33 on the side wall 213 is the same.

The handle member 31 is a Π-shaped body, which comprises a first arm 311, a second arm 312, and a handle 313 connected to the first arm 311 and the second arm 312. The first arm 311 is the same as the second arm 312. Only the first arm 311 is illustrated below. A pivot connection piece 3111 extends from an end of the first arm 311. A pivot connection hole 3112 and a connection hole 3113 are opened on the pivot connection piece 3111. Also, a second fastening groove 3114 is disposed at a position near the pivot connection hole 3112.

A joint member 3131 of a corresponding fastener 13 is further disposed at a middle position of the handle 313.

The linked member 32 on the side wall 212 is a sheet body. A pivot connection hole 321 and a connection hole 322 are disposed on the linked member 32. A first fastening groove 323 is disposed at a position near the pivot connection hole 321.

The handle member 31 is pivotally connected at a position near a bottom end of the side wall 112, that is, a position corresponding to the positioning pin 25, in a rotatable relation through the pivot connection hole 3112. The linked member 32 is pivotally connected at a position near a top end of the side wall 112, that is, a position corresponding to the positioning pin 24, in a rotatable relation through the pivot connection hole 321. The connecting rod member 33 on the side wall 212 is a rod body. One end of the connecting rod member 33 is connected to the connection hole 3113 of the handle member 31, and the other end of the connecting rod member 33 is connected to the connection hole 322 of the linked member 32 respectively. Furthermore, the circle center of the connection hole 3113 and the circle center of the pivot connection hole 3112 on the pivot connection piece 3111 are not overlapped in each other. So that when the handle member 31 rotates, the linked member 32 can be actuated to rotate together through the connecting rod member 33.

Figure 4A:
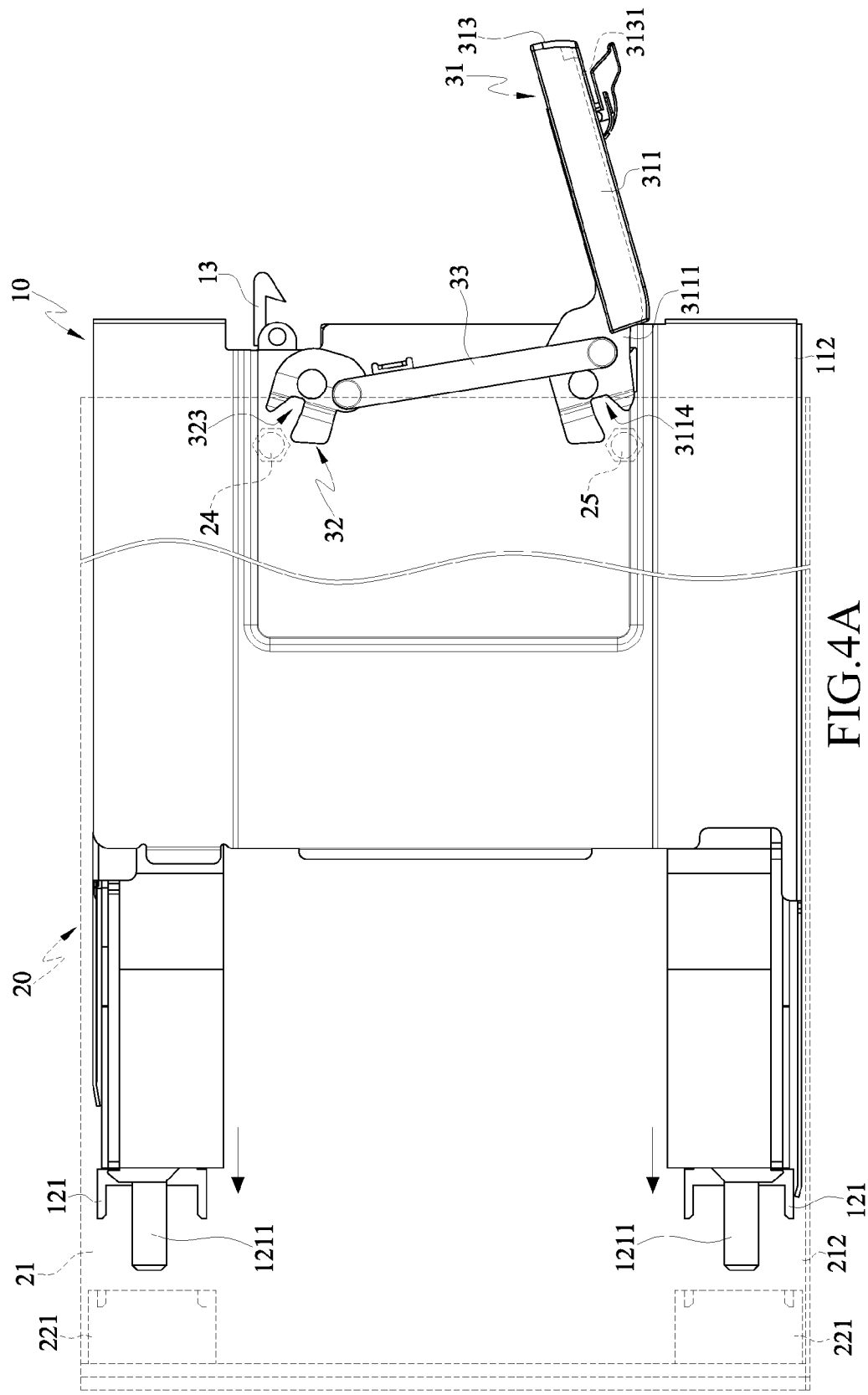
FIGS. 4A to 4C are schematic views of actions according to the present invention.
Figure 4B:
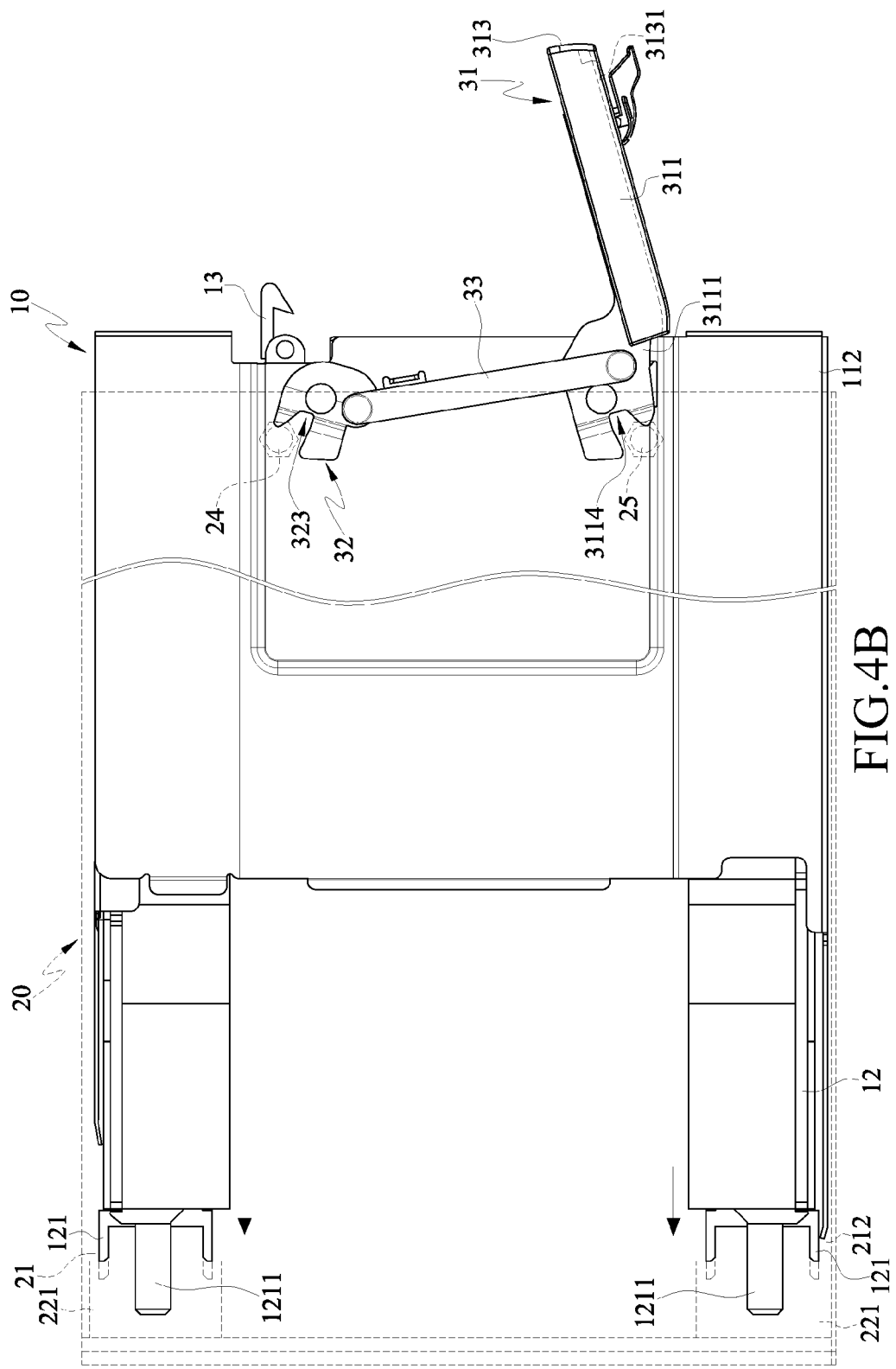
Figure 4C:
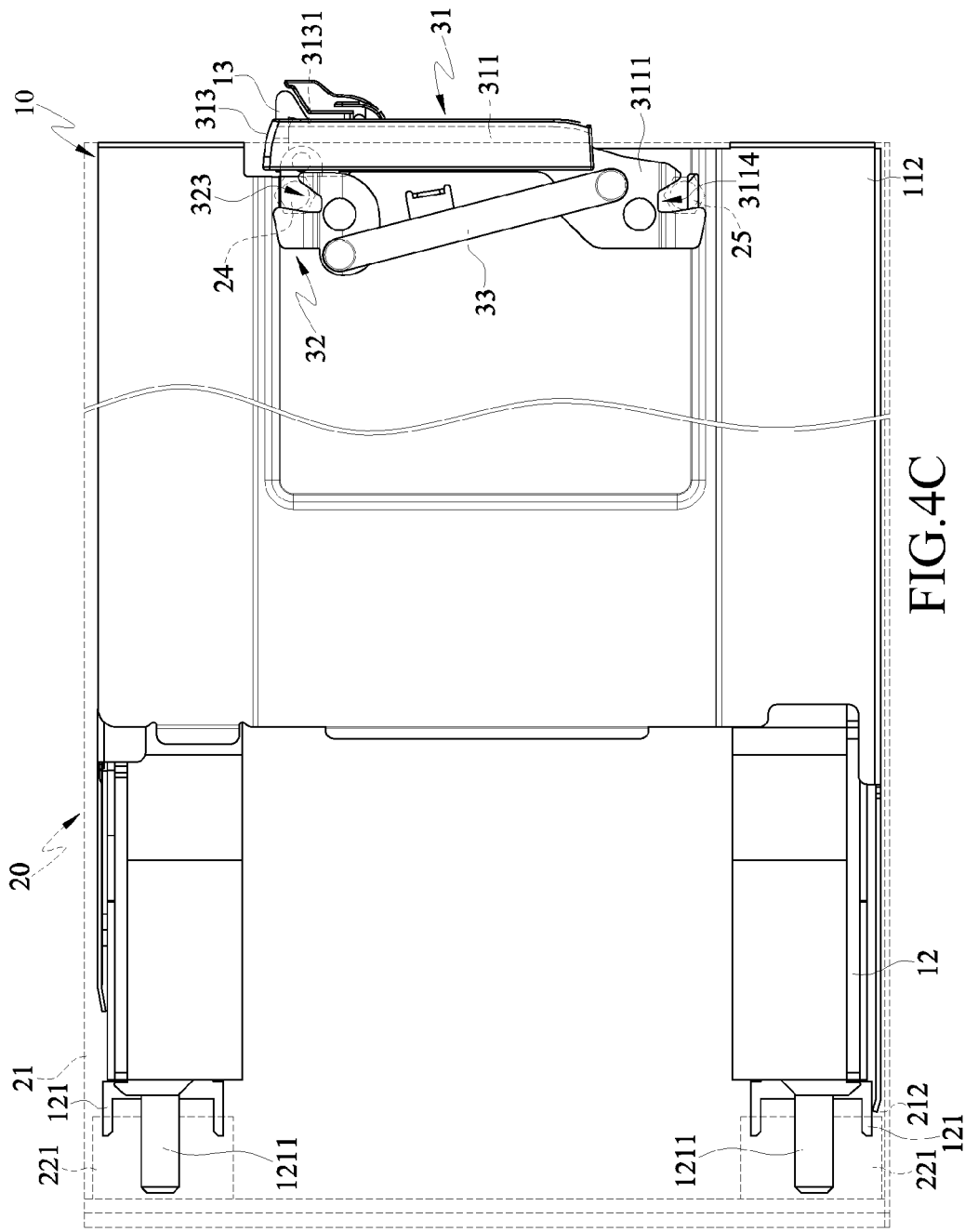

FIGS. 4A, 4B, and 4C show a locking structure 30 for a draw-type electronic device according to the present invention. When the draw-type electronic device 10 needs to be installed in the installation groove 23 of the main unit 20, the handle member 31 is rotated away from the case 11 to an angle. Subsequently, the case 11 matches the installation groove 23 and is placed across a support rib. Next, the draw-type electronic device 10 is pushed into the installation groove 23, so as to enable an edge connector 121 of the draw-type electronic device 10 to contact the connector unit 221 of the main unit 20. However, the edge connector 121 is not inserted in the connector unit 221 to accomplish the electrical connection. When the draw-type electronic device 10 is at this position, the second fastening groove 3114 of the handle member 31 is corresponding to the positioning pin 25, and the first fastening groove 323 of the linked member 32 is corresponding to the positioning pin 24.

In order to accomplish the electrical connection between the draw-type electronic device 10 and the main unit 20, the handle member 31 rotates and approaches the draw-type electronic device 10. At the same time, the handle member 31 together drives the linked member 32 to rotate. The second fastening groove 3114 of the handle member 31 urges the positioning pin 25, and the first fastening groove 323 of the linked member 32 urges the positioning pin 24, so that the draw-type electronic device 10 moves a distance inwardly. Therefore, the positioning pin 24 becomes a point of application to the first fastening groove 323 so that the first fastening groove 323 latches on the positioning pin 24; and the positioning pin 25 becomes a point of application to the second fastening groove 3114 so that the second fastening groove 3114 latches on the positioning pin 25. Through the distance, the edge connector 121 is inserted in the connector unit 221 to accomplish the electrical connection. A joint unit 1211 may be disposed on the edge connector 121. The electronic device 10 shifts for the distance to enable the joint unit 1211 of the edge connector 121 to be inserted in the connector unit 221, so that an electrical connection between the electronic device 10 and the main unit 20 is accomplished.

The electronic device 10 may comprise two motherboards 12, and two edge connectors 121 located at an end of the motherboards 12 respectively. Each edge connector 121 may comprise two joint units 1211 on the tow ends; the joint units 1211 guides the edge connector 121 to make sure that the edge connector 121 are located on the correct position, and that the electrical connection between the electronic device 10 and the main unit 20 steadier are stable.

In addition, at the same time, the handle member 31 is held against the electronic device 10 and the fastener 13 at a top edge of the case 11 is fastened to a joint member 3131 of the handle 313, so as to secure the handle 313 on the case.

On the contrary, when the draw-type electronic device 10 needs to be detached from the installation groove 23 of the main unit 20, the fastener 13 is first detached from the joint member 3131, and then the handle member 31 is rotated. The handle member 31 drives the linked member 32 to rotate together and move a distance, so as to first detach the edge connector 121 from the connector unit 221 and then pull the handle member 31 to move out the draw-type electronic device 10.

For the locking structure for the electronic device according to the present invention, through the design of linking the handle member 31 and the linked members 32, when the action of electrical connection between the edge connectors 121 and the connector unit 221 is performed, the two positioning pins 24 and 25 are pressed at the same time to enable the electronic device 10 to shift for a distance, and the force applied in a way that forces above and below are equal controls the electronic device 10 effectively to achieve correct electrical connection smoothly, so as to ensure the correct electrical connection and also avoid damages to the edge connectors 121 and the connector unit 221 caused by inappropriate force application. By pressing the two positioning pins 24 and 25 at the same time, the electronic device 10 whole shift for a distance at the same time either. Therefore, the two edge connectors 121 electronically connect to the main unit 20 steady.

What is claimed is:

1. A locking structure for a draw-type electronic device, disposed on a case of the draw-type electronic device, comprising:

two linked members, pivotally connected to the case in a rotatable relation, wherein each linked members comprises a first fastening groove adjacent to a position of pivotal connection;

a handle member, pivotally connected to the case in a rotatable relation, wherein two second fastening grooves are respectively disposed adjacent to a position of pivotal connection of bottom sides of the handle member; and two connecting rod members, connected to the handle member and the linked member, wherein the handle member is rotated to actuate the linked members respectively to rotate together, so as to enable the electronic device to shift for a distance.

2. The locking structure for the draw-type electronic device according to claim 1, wherein the electronic device is installed in a main unit, four positioning pins are disposed in the main unit, the first fastening grooves of the linked members and the second fastening grooves of the handle member match the four positioning pins, the linked member and the handle member are rotated, the first fastening groove and the second fastening groove urge the two positioning pins, and the positioning pins becomes points of application to the first fastening grooves and the second fastening grooves, so that the draw-type electronic device shifts for the distance.

3. The locking structure for the draw-type electronic device according to claim 2, wherein an edge connector is disposed on the electronic device, a connector unit is disposed on the main unit, and the electronic device shifts for the distance to enable the edge connector to be inserted in the connector unit, so that an electrical connection between the electronic device and the main unit is accomplished.

4. The locking structure for the draw-type electronic device according to claim 3, wherein an joint unit is disposed on the edge connector, and the electronic device shifts for the distance to enable the joint unit of the edge connector to be inserted in the connector unit, so that the electrical connection between the electronic device and the main unit is accomplished.

5. The locking structure for the draw-type electronic device according to claim 2, wherein the two positioning pins are pressed at the same time, so that the electronic device whole shift for a distance at the same time.

6. The locking structure for the draw-type electronic device according to claim 1, wherein a fastener is disposed on the electronic device, a joint member is disposed on the handle member, the handle member is rotated and held against the electronic device, and the fastener fastens the joint member of the handle member.

7. The locking structure for the draw-type electronic device according to claim 1, wherein the handle member comprises a pivot connection piece, and circle centers of two connection holes and circle centers of two pivot connection holes on the pivot connection piece are not overlapped in each other.

* * * * *